United States Patent [19]

Liaw et al.

[11] Patent Number: 5,795,827

[45] Date of Patent: Aug. 18, 1998

[54] METHOD FOR REDUCING THE RESISTANCE OF SELF-ALIGNED CONTACTS, FOR TRIPLE POLYSILICON SRAM DEVICES

[75] Inventors: Jhon-Jhy Liaw, Taipei; Ding-Shan Wang, Hsin-Chu, both of Taiwan

[73] Assignee: Taiwan Semiconductor Manufacturing Company, Ltd., Hsin-Chu, Taiwan

[21] Appl. No.: 783,981

[22] Filed: Jan. 15, 1997

[51] Int. Cl.⁶ .................................. H01L 21/44
[52] U.S. Cl. ......................... 438/663; 438/664
[58] Field of Search ..................... 438/153, 238, 438/649, 656, 660, 663, 664

[56] References Cited

U.S. PATENT DOCUMENTS 5,461,006 10/1995 Mehra ............................ 437/200
5,510,296 4/1996 Yen et al. ........................ 437/200
5,541,137 7/1996 Manning et al. ................. 438/564
5,581,114 12/1996 Bashir et al. .................... 257/588

Primary Examiner—John Niebling
Assistant Examiner—Joni Y. Chang
Attorney, Agent, or Firm—George O. Saile; Stephen B. Ackerman

[57] ABSTRACT

A process for fabricating MOSFET devices, for a SRAM cell, using a polycide contact structure, self-aligned to an underlying source and drain region, has been developed. This process features the use of a high temperature, rapid thermal anneal step, used to dissolve native oxide at the polycide-source and drain interface, thus reducing the resistance at the interface of the polycide self-aligned structure, and the underlying source and drain area.

28 Claims, 4 Drawing Sheets

METHOD FOR REDUCING THE RESISTANCE OF SELF-ALIGNED CONTACTS, FOR TRIPLE POLYSILICON SRAM DEVICES

BACKGROUND OF THE INVENTION (1) Field of the Invention

The present invention relates to a process used to fabricate metal oxide semiconductor field effect transistors, (MOSFET), devices, and more specifically to process used to reduce the resistance of a self-aligned contact, (SAC), structure, used for the fabrication of MOSFET devices used for static random access memory, (SRAM), cells.

(2) Description of Prior Art

Static random access memory, (SRAM), cells, are now being fabricating using high speed, high density, complimentary metal oxide semiconductor, (CMOS), devices. Conventional SRAM cells are usually configured using either four n-channel, and two p-channel, MOSFET devices, or using four n-channel, and two resistor load devices. The four n-channel, and two resistor load type, SRAM configuration consumes less area then counterparts using both n-channel and p-channel devices, and thus has been used extensively. A triple polysilicon process has been used to fabricate devices used for the SRAM cell, comprised of n-channel and resistor load devices. In this process one polysilicon layer is used for the gate structure of the CMOS device, while a second polysilicon layer is used for the load resistors. A third polysilicon layer is used as part of a polycide, (metal silicide-polysilicon), composite structure, providing contact to source and drain regions of an underlying n-channel device. To further decrease the area needed to create this type of SRAM cell device, (n-channel and resistor loads), a self aligned contact, (SAC), concept has been developed. The SAC procedure consists of a SAC opening, in a dielectric layer, used to expose an underlying source and drain area. However the underlying source and drain area resides in a narrow space between two gate structures, and therefore the SAC opening for a subsequent SAC structure, can be enlarged to open an area not only over the entire source and drain regions, but also over adjacent portions of the gate structures. This procedure eliminates the difficult, conventional photolithographic procedure, used to open a contact hole in an insulator layer, with the contact hole having to fully land on the entire, underlying source and drain region. With that conventional procedure, in order to insure fully landed alignment to the underlying source and drain region, additional area has to be made available, thus increasing the SRAM cell size, and reducing SRAM density.

The ability to efficiently use the SAC structure is dependent on the ability to minimize the resistance at the interface between the overlying polycide structure and the top surface of the underlying source and drain region, exposed in the SAC opening. The polycide structure used with the triple polysilicon layer, SRAM process, is comprised of an underlying polysilicon layer, and an overlying tungsten silicide layer. Prior to the deposition of the underlying polysilicon layer, a thin, native oxide can reside on the top surface of the source and drain region, exposed in the SAC opening. If the native oxide is not removed, the interface resistance, as well as other SRAM parameters can be adversely influenced. Therefore this invention will teach a process for reducing the SAC interface resistance, after the polycide structure has been formed in the SAC opening, via a high temperature, rapid thermal anneal, (RTA), procedure. This is accomplished by disintegrating or dissolving the native oxide, which resided at the polycide-source and drain interface. Prior art such as Mehra, in U.S. Pat. No. 5,461,006, and Yen, et al. in U.S. Pat. No. 5,510,296, show methods of reducing the contact resistance of polycide structures to underlying silicon surfaces, however these inventions do not teach the RTA process used to break or dissolve a native oxide layer, between an overlying polycide structure and an underlying silicon surface, in which the polycide structure is used for a triple polysilicon layer, SRAM process.

SUMMARY OF THE INVENTION

It is an object of this invention to fabricate MOSFET devices for an SRAM cell, using a self aligned contact, (SAC), process, allowing polysilicon to contact an underlying source and drain region.

It is another object of this invention to minimize the resistance of a contact structure in the SAC opening, at the interface between an overlying polysilicon layer and an underlying source and drain region.

It is yet another object of this invention to use a high temperature, rapid thermal anneal, (RTA), process, after formation of the contact structure in the SAC opening, to reduce the interface resistance, between an overlying polysilicon layer and the underlying source and drain region.

In accordance with the present invention a process is described for fabricating MOSFET devices used for SRAM cells, using a SAC process for polycide contact to underlying silicon regions, in which the interface resistance in the SAC opening, between an overlying SAC structure, and an underlying silicon region, has been reduced via an RTA procedure. After formation of polycide gate structures, on thin gate oxides, and with the polycide gate structure capped with an insulator layer, lightly doped source and drain regions are formed, in areas not covered by the insulator capped, polycide gate structures. After formation of insulator spacers, on the sides of the polycide gate structures, heavily doped source and drain regions are formed in the space between polycide gate structures. A insulator layer is deposited and patterned to produce a self-aligned contact, (SAC), opening, exposing a heavily doped source and drain region in the space between insulator capped, polycide gate structures. Depositions of an underlying polysilicon layer, and an overlying metal silicide layer, are followed by patterning of the metal silicide and polysilicon layers to create a polycide SAC structure, in the SAC opening, partially overlying the insulator capped, polycide gate structures. Deposition of a composite interlevel dielectric layer is followed by a low temperature anneal, used to reflow the second interlevel dielectric layer. A high temperature RTA procedure is next employed to dissolve native oxide between the overlying polysilicon layer, of the polycide SAC structure, and the underlying source and drain region, resulting in an interface resistance reduction. Subsequent processing includes opening a contact hole, in the composite interlevel dielectric layer, exposing the polycide SAC structure, in the SAC opening, followed by creation of a metal plug, filling the contact hole opening in the composite interlevel dielectric layer, and contacting the underlying polycide SAC structure. Creation of a metal interconnect, is then performed, providing contact to the metal plug.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFET devices, used for an SRAM cell, using a SAC process which features resistance reductions as a result of a RTA procedure, will now be described in detail. The SRAM cell, to which this invention will be applied to, will be an SRAM cell comprised of n-channel, MOSFET devices, and load resistors. This invention can also be applied to SRAM cells comprised of n-channel, MOSFET devices, and p-channel, MOSFET devices. This process will then use polysilicon load resistors, in place of the p-channel, MOSFET devices.

Figure 1:
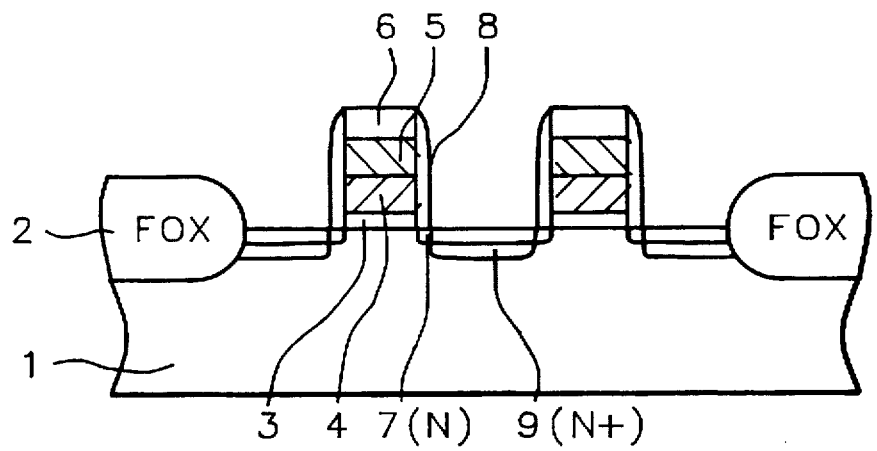
FIGS. 1–6, which schematically, in cross-sectional style, present key stages of fabrication of the MOSFET devices, used for creation of an SRAM cell, incorporating the SAC process, and the key RTA anneal procedure, used to reduce the interface resistance between a polycide SAC structure, and an underlying source and drain region.

A P type, single crystalline, silicon substrate, 1, with a <100> crystallographic orientation, is used, and shown schematically in FIG. 1. Field oxide, (FOX), regions, 2, formed for isolation purposes, are thermally grown to a thickness between about 3000 to 5000 Angstroms, using thermal oxidation procedures. Subsequent device regions are protected from the FOX oxidation procedure by oxidation resistant masking patterns, comprised of a silicon nitride-silicon oxide composite masking layer. After removal of the composite, oxidation resistant mask, a thin gate, silicon dioxide layer, 3, is thermally grown, in an oxygen steam ambient, at a temperature between about 850° to 1000° C., to a thickness between about 50 to 250 Angstroms. Next a first layer of in situ doped polysilicon, 4, is deposited using low pressure chemical vapor deposition, (LPCVD), procedures, at a temperature between about 500° to 700° C., to a thickness between about 500 to 2000 Angstroms, using silane as a source, and with the addition of phosphine to provide the needed dopant. A first layer of tungsten silicide, 5, is then deposited, using LPCVD procedures, at a temperature between about 400° to 600° C., to a thickness between about 750 to 1500 Angstroms, using tungsten hexafluoride and silane as a source. Finally a first silicon oxide layer, 6, is deposited using either LPCVD or plasma enhanced chemical vapor deposition, (PECVD), procedures, at a temperature between about 300° to 700° C., to a thickness between about 1000 to 3000 Angstroms, using tetraethylorthosilicate, (TEOS), as a source.

Conventional photolithographic and anisotropic reactive ion etching, (RIE), procedures, using $CHF_3$ as an etchant for first silicon oxide layer, 6, and $Cl_2$ as an etchant for both first tungsten silicide layer, 5, and first polysilicon layer, 4, are used to produce the silicon oxide capped, polycide gate, (first tungsten silicide-first polysilicon), structures, shown schematically in FIG. 1. After photoresist removal via plasma oxygen ashing and careful wet cleans, a lightly doped source and drain region, 7, is next created via ion implantation of phosphorous or arsenic, at an energy between about 25 to 75 KeV, at a dose between about 5E11 to 5E13 atoms/$cm^2$. A second silicon oxide layer is deposited, again via use of either LPCVD or PECVD procedures, at a temperature between about 300° to 700° C., to a thickness between about 1500 to 4000 Angstroms, using TEOS as a source, followed, by an anisotropic RIE procedure, using $CHF_3$ as an etchant, to create insulator spacers, 8, schematically shown in FIG. 1. The space between polycide gate spacers, to be used as part of the surface area for contact the subsequent SAC structure is between about 0.3 by 0.5 uM. Heavily doped source and drain regions, 9, are then produced via ion implantation of either arsenic or phosphorous, at an energy between about 30 to 100 KeV, at a dose between about 1E14 to 1E16 atoms/$cm^2$. This region is also shown schematically in FIG. 1.

Figure 2:
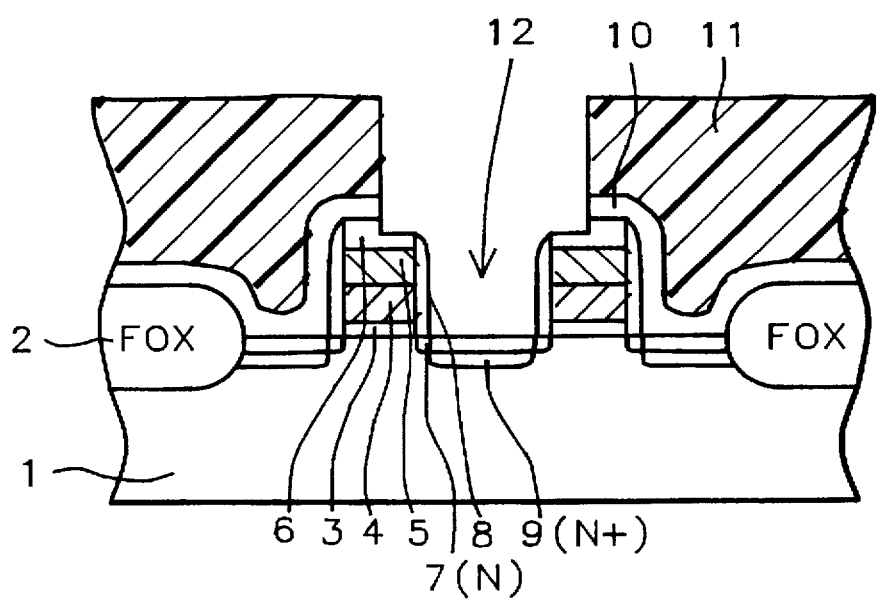

A third layer of silicon oxide, 10, is deposited, again using either LPCVD or PECVD procedures, at a temperature between about 300° to 700° C., to a thickness between about 1000 to 2000 Angstroms, using TEOS as a source. A first photoresist shape, 11, is formed, allowing a self-aligned contact, (SAC), opening, 12, with the opening having a dimension of about 0.4 by 0.6 uM, to be created by anisotropic RIE of third silicon oxide layer, 10, using $CHF_3$ as an etchant. SAC opening, 12, schematically shown in FIG. 2, exposes a heavily source and drain region, 9, in the space between polycide gate structures. The design of SAC opening, 12, also results in the removal of third silicon oxide layer, 10, and of a portion of the capping, first silicon oxide layer, 6, from the top surface of the polycide gate structures, in a region where the polycide gate structures border the space between polycide gate structures.

Figure 3:
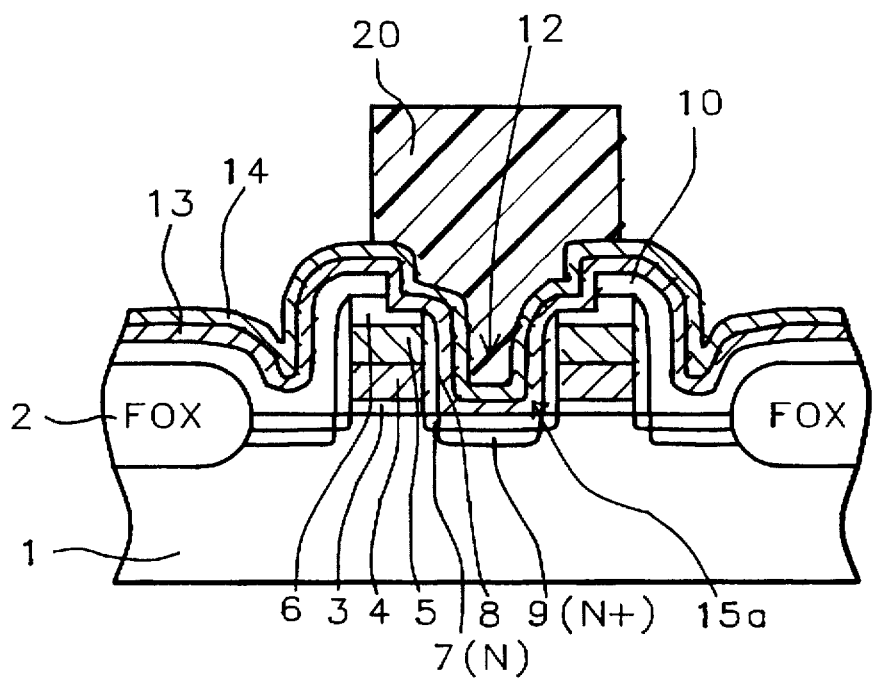

After removal of first photoresist shape, 11, via plasma oxygen ashing and careful wet cleans, a second layer of polysilicon, 13, is deposited using LPCVD procedures, at a temperature between about 500° to 700° C., to a thickness between about 450 to 650 Angstroms, including the addition of phosphine or arsine to a silane ambient, for purposes of in situ doping. A second layer of tungsten silicide, 14, is next deposited using LPCVD procedures, at a temperature between about 400° to 600° C., to a thickness between about 1000 to 1400 Angstroms, using tungsten hexafluoride and silane as a source. Interface, 15a, shown schematically in FIG. 3, between second polysilicon layer, 13, and heavily doped source and drain region, 9, in SAC opening, 12, can contain between about 10 to 50 Angstroms of native oxide, produced in the time period between removal of photoresist shape, 11, and the deposition of second polysilicon layer, 13. This native oxide, at interface, 15a, if not treated, can result in unwanted resistances, adversely influencing the operation of an SRAM cell. A second photoresist shape, 20, is formed to be used as a mask for subsequent patterning of a polycide SAC structure.

Figure 4:
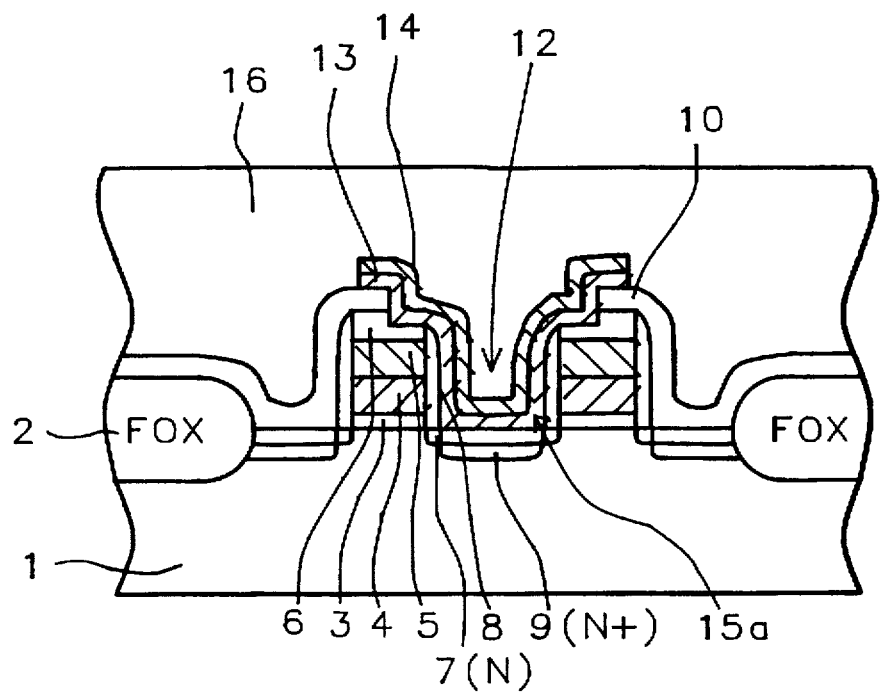

A anisotropic RIE etching procedure, using $Cl_2$ as an etchant, is employed to create a polycide SAC structure, comprised of an overlying tungsten silicide layer, 14, and an underlying second polysilicon layer, 13,, shown schematically in FIG. 4. Second photoresist shape, 20, used as a mask for the patterning of polycide SAC structure, is removed via plasma ashing and wet clean procedures. A composite interlevel dielectric layer, 16, is next deposited. The composite interlevel dielectric layer, 16, is comprised of an underlying PECVD deposited, TEOS oxide layer, deposited at a temperature between about 300° to 700° C., to a thickness between about 1000 to 2000 Angstroms, and an overlying PECVD deposited, boron-phosphorous doped, TEOS, (BPTEOS), oxide layer, deposited at a temperature between about 500° to 700° C., to a thickness between about 3000 to 12000 Angstroms. A temperature cycle between about 750° to 900° C. is then used to allow the overlying BPTEOS to reflow, resulting in a smooth topology of the composite interlevel dielectric layer, shown schematically in FIG. 4.

Figure 5:
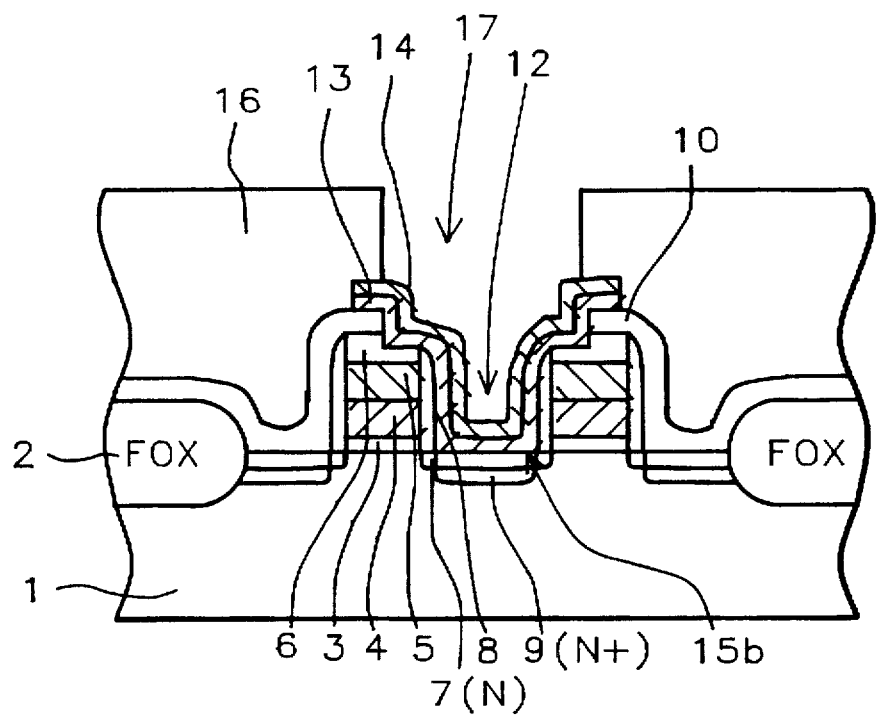

A critical stage of the fabrication sequence, used to create the MOSFET devices of the SRAM cell, is next addressed. A rapid thermal anneal, (RTA), procedure is performed at a temperature between about 950° to 1100° C., in a nitrogen ambient, for a time between about 10 to 60 sec. This anneal allows the disintegration or dissolving of the native oxide about 10 to 50 Angstroms at interface 15a, resulting in interface, 15b, shown in FIG. 5, comprised of an absence of, or a dis-continuous native oxide, thus allowing a lowering of the interface resistance between the polycide gate structure, and the underlying heavily doped source and drain region, to be realized. Photolithographic and RIE procedures, using $CHF_3$ as an etchant, are used to open contact hole, 17, in composite interlevel dielectric layer, 16, exposing the second tungsten silicide layer, 14, of the polycide SAC structure, also shown schematically in FIG. 5. Photoresist removal is again performed via plasma oxygen ashing and careful wet cleans.

Figure 6:
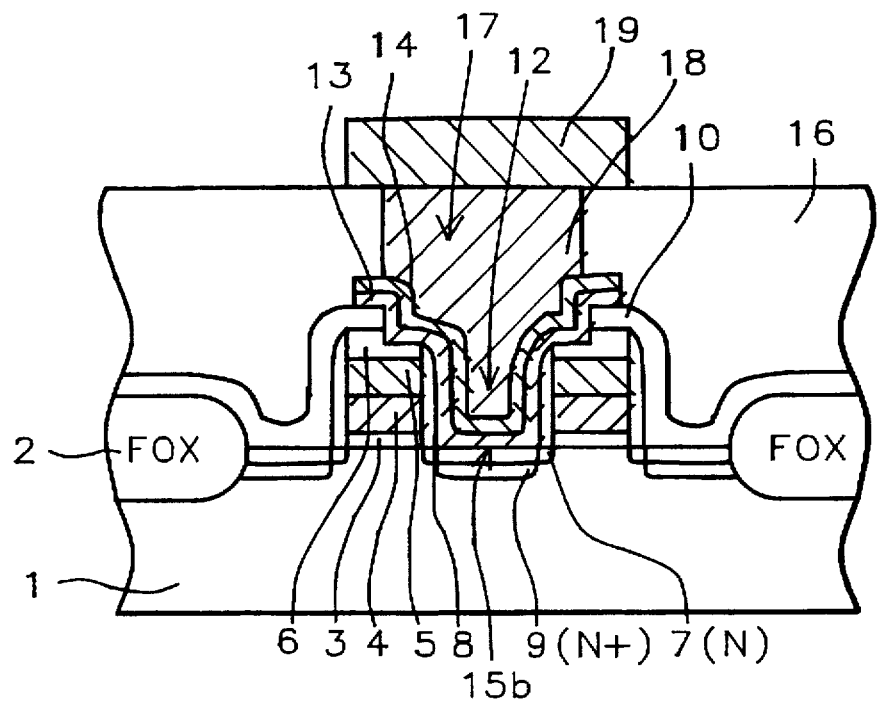

Contact hole opening, 17, is then filled with a tungsten plug, 18, schematically shown in FIG. 6. Tungsten plug, 18, can be formed by selective deposition of tungsten, only on the exposed top surface of second tungsten silicide layer, 14, via LPCVD procedures, at a temperature between about 400° to 500° C., to a thickness between about 4000 to 7000 Angstroms using tungsten hexafluoride as a source. Tungsten plug, 18, can also be formed by a blanket tungsten deposition, at a temperature between about 400° to 500° C., to a thickness between about 4000 to 7000 Angstroms, followed by removal of unwanted tungsten, from the top surface of composite interlevel dielectric layer, 16, via either RIE, using $Cl_2$ as an etchant, or via chemical mechanical polishing procedures. A metal deposition of aluminum, containing between about 1 to 3% copper, is performed, using r.f. sputtering procedures, to a thickness between about 3000 to 6000 Angstroms. Conventional photolithographic and RIE procedures, using $Cl_2$ as an etchant, are used to create interconnect metal structure, 19, schematically shown in FIG. 6. Photoresist removal is once again accomplished via plasma oxygen ashing, and careful wet cleans.

The creation of the load resistors, used in SRAM cells, in place of p-channel, MOSFET devices, was not shown in the fabrication sequence used with this invention. However if desired for a SRAM configuration using load resistors, the process sequence would initiate with the deposition of another dielectric layer, at a stage after the formation of the polycide SAC structure. Next a deposition of a third polysilicon layer, in situ doped, or grown intrinsically and doped via ion implantation procedures, is performed. Patterning of the third polysilicon layer is next addressed via conventional photolithographic and RIE procedures. After removal of photoresist, the composite interlevel dielectric layer, 16, is deposited and the process sequence, previously described for creation of the tungsten plug and overlying interconnect metallization structures, is continued.

In addition if the SRAM cell is configured utilizing p-channel, MOSFETs, along with the n-channel MOSFET devices, at specific stages of the process, in specific regions of the SRAM cell, an N well region is formed, and subsequently used to accommodate p-channel MOSFET, which is created by selectively placing P type source and drain regions, in areas used for p-channel devices.

Figure 7:
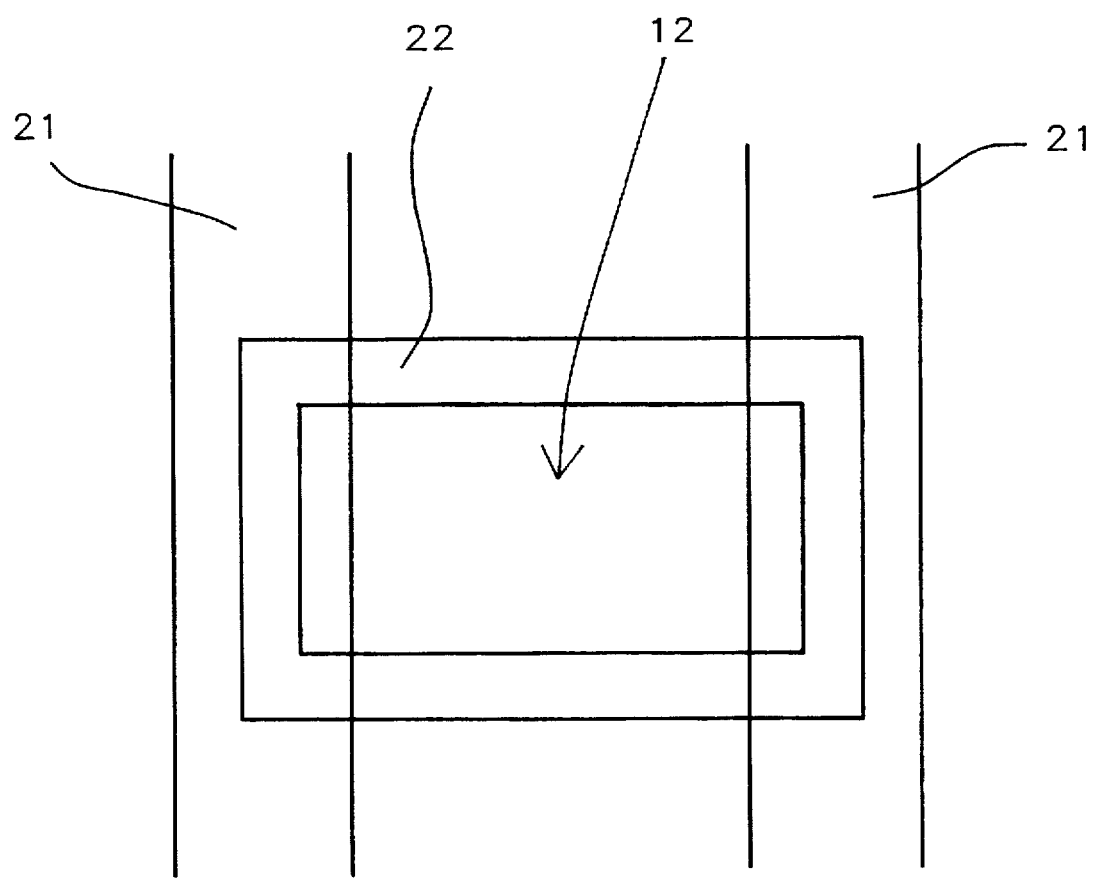
FIG. 7, which schematically illustrates a top view of the SAC design used for the MOSFET device, of the SRAM cell.

FIG. 7, shows the top view of a MOSFET device, in which the SAC concept has been used. The SAC opening, 12, is created to a larger dimension, about 0.4 to 0.6 uM, than the space between word lines, or polycide gate structures, 21, comprised of first tungsten silicide layer, 5, and first polysilicon layer, 4. The polycide SAC structure, 22, comprised of second tungsten silicide layer, 14, and underlying second polysilicon layer, 13, is created to self-align to an underlying source and drain region, while overlapping SAC opening, 12. The interface between overlying second polysilicon layer, 13, and the underlying source and drain region, has been unblocked by native oxide disintegration, as a result of a RTA procedure described in this invention. The SAC interface resistance, for an opening of 0.5 by 0.3 uM, has been reduced from about 1200 ohms to about 400 ohms, via use of the RTA procedure.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating metal oxide semiconductor field effect transistor (MOSFET) devices, for a static random access memory (SRAM) cell, on a semiconductor substrate, in which an anneal is used to reduce an interface resistance between an overlying polycide structure, and an underlying source and drain region, of said MOSFET devices, comprising the steps of:

forming field oxide regions in said semiconductor substrate;

growing a gate insulator layer on said semiconductor substrate, in areas not covered by said field oxide regions;

depositing a first polysilicon layer on said gate insulator layer;

depositing a first metal silicide layer on said first polysilicon layer;

depositing a first insulator layer on said first metal silicide layer;

patterning of said first insulator layer, of said first metal silicide layer, and of said first polysilicon layer, to form polycide gate structures, on said gate insulator layer;

ion implanting a first conductivity imparting dopant into said semiconductor substrate, in regions not covered by said polycide gate structures, to form a lightly doped source and drain region;

depositing a second insulator layer;

anisotropic etching of said second insulator layer to form insulator spacers on sides of said polycide gate structures;

ion implanting a second conductivity imparting dopant into said semiconductor substrate, in regions not covered by said polycide gate structures, or not covered by said insulator spacers, to form a heavily doped source and drain region;

depositing a third insulator layer;

opening a hole in said third insulator layer, creating a self-aligned contact, (SAC), opening, exposing said heavily doped source and drain region, in said semiconductor substrate, in a space between said polycide gate structures, with said insulator spacers;

depositing a second polysilicon layer, including deposition on said heavily doped source and drain region in said SAC opening, in said space between said polycide gate structures;

depositing a second metal silicide layer on said second polysilicon layer;

patterning of said second metal silicide layer, and of said second polysilicon layer, to create a polycide, self-aligned contact, (SAC), structure, completely overlying said SAC opening, and with said polycide SAC structure partially overlying a portion of said polysilicon gate structures, in regions where said polycide gate structures are adjacent to said SAC opening;

depositing a composite interlevel dielectric layer on said semiconductor substrate, including deposition on said polycide SAC structure;

annealing to dissolve native oxide at an interface between overlying said second polysilicon layer, of said polycide SAC structure, and said heavily doped source and drain region;

opening a hole in said composite interlevel dielectric layer to expose top surface of said polycide SAC structure;

forming a metal plug in said hole, in said composite interlevel dielectric layer, contacting underlying, said polycide SAC structure; and forming an interconnect metallization structure, overlying and contacting, said metal plug, in said hole, in said composite interlevel dielectric layer.

2. The method of claim 1, wherein said first polysilicon layer, of said polycide gate structures, is deposited using low pressure chemical vapor deposition (LPCVD) procedures, at a temperature between about 500° to 700° C., to a thickness between about 500 to 1500 Angstroms, using silane as a source, and using phosphine to provide in situ doping.

3. The method of claim 1, wherein said first metal silicide layer, of said polycide gate structures, is tungsten silicide, deposited using LPCVD procedures, at a temperature between about 400° to 600° C., to a thickness between about 750 to 1500 Angstroms, using silane and tungsten hexafluoride as a source.

4. The method of claim 1, wherein said polycide gate structures are formed via anisotropic, reactive ion etch (RIE), using $CHF_3$ as an etchant for said first insulator layer, and using $Cl_2$ as an etchant for said first metal silicide layer, and for said first polysilicon layer.

5. The method of claim 1, wherein said insulator spacers, formed on said sides of said polycide gate structures, are comprised of silicon oxide, deposited using LPCVD or plasma enhanced chemical vapor deposition procedures, using tetraethylorthosilicate (TEOS) as a source, to a thickness between about 1500 to 4000 Angstroms, and etched via anisotropic RIE procedures, using $CHF_3$ as an etchant.

6. The method of claim 1, wherein the space, in said semiconductor substrate, between said polycide gate structures, with said insulator spacers on the sides of said polycide gate structures, is between about 0.3 by 0.5 uM.

7. The method of claim 1, wherein said second imparting conductivity dopant, used to form said heavily doped source and drain region, in the exposed region of said semiconductor substrate, between said polycide gate structures, is arsenic or phosphorous, ion implanted at an energy between about 30 to 100 KeV, at a dose between about 1E14 to 1E16 atoms/cm$^2$.

8. The method of claim 1, wherein said SAC opening, in said third insulator layer, exposing said heavily doped source and drain region, between said polycide gate structures, is formed via anisotropic RIE procedures, using $CHF_3$ as an etchant, with said SAC opening having a dimension of about 0.4 by 0.6 uM.

9. The method of claim 1, wherein said second polysilicon layer is deposited using LPCVD procedures, at a temperature between about 500° to 700° C., to a thickness between about 450 to 650 Angstroms, using silane as a source, and using phosphine to provide in situ doping.

10. The method of claim 1, wherein said second metal silicide layer is tungsten silicide, deposited using LPCVD procedures, at a temperature between about 400° to 600° C., to a thickness between about 1000 to 1400 Angstroms, using tungsten hexafluoride and silane as a source.

11. The method of claim 1, wherein said polycide SAC structure is formed via anisotropic RIE procedures, using $Cl_2$ as an etchant for said second metal silicide layer, and for said second polysilicon layer.

12. The method of claim 1, wherein said composite interlevel dielectric layer is comprised of an overlying layer of boron-phosphorous, doped silicon oxide, deposited using PECVD procedures, at a temperature between about 500° to 700° C., to a thickness between about 3000 to 12000 Angstroms, using TEOS as a source, and comprised of an underlying layer of silicon oxide, deposited using PECVD procedures, at a temperature between about 300° to 700° C., to a thickness between about 1000 to 2000 Angstroms, using TEOS as a source.

13. The method of claim 1, wherein said annealing is a rapid thermal anneal (RTA) procedure, used to dissolve between about 10 to 50 Angstroms of native oxide, at the interface between said second polysilicon layer, and said heavily doped source and drain region, in said SAC opening, said RTA procedure is performed at a temperature between about 950° to 1100° C., for a time between about 10 to 60 sec., in a nitrogen ambient.

14. The method of claim 1, wherein said metal plug is tungsten, obtained via selective LPCVD procedures, at a temperature between about 400° to 500° C., using tungsten hexafluoride as a source.

15. A method for forming a polycide self-aligned contact, (SAC), structure, for MOSFET devices, in an SRAM cell, on a semiconductor substrate, using an RTA procedure to reduce a level of native oxide at an interface between said polycide SAC structure, and a heavily doped source and drain region, of said semiconductor substrate, comprising the steps of:

growing a gate insulator layer on said semiconductor substrate;

depositing an in situ doped, first polysilicon layer, on said gate insulator layer;

depositing a first tungsten silicide layer, on said first polysilicon layer;

depositing a first silicon oxide layer on said first tungsten silicide layer;

patterning of said first silicon oxide layer, of said first tungsten silicide layer, and of said first polysilicon layer, to from polycide gate structures on underlying, said gate insulator layer;

ion implanting a first conductivity imparting dopant into a region of said semiconductor substrate, not covered by said polycide gate structures, to form a lightly doped source and drain region;

depositing a second silicon oxide layer;

anisotropic etching of said second silicon oxide layer to form silicon oxide spacers on sides of said polycide gate structures;

ion implanting a second conductivity imparting dopant into a region of said semiconductor substrate, not covered by said polycide gate structures, or not covered by said silicon oxide spacers, to form said heavily doped source and drain region in region between said polycide gate structures;

depositing a third silicon oxide layer;

forming a self-aligned contact, (SAC), opening in said third silicon oxide layer, exposing said heavily doped source and drain region, in region of said semiconductor substrate, between said polycide gate structures and said silicon oxide spacers;

depositing an in situ doped, second polysilicon layer, on said semiconductor substrate, including deposition on said heavily doped source and drain region, exposed in SAC opening;

depositing a second tungsten silicide layer on said second polysilicon layer;

patterning of said second tungsten silicide layer, and of said second polysilicon layer, to form said polycide SAC structure, completely overlying said heavily doped source and drain region, in said SAC opening, and partially overlying a portion of a top of said polycide gate structures, in areas where said polycide gate structures abut said SAC opening;

depositing a composite interlevel dielectric layer, completely covering said polycide SAC structure;

performing said RTA procedure to reduce level of said native oxide at interface between said second polysilicon layer, of said polycide SAC structure, and said heavily doped source and drain region, in SAC opening;

opening a hole in said composite interlevel dielectric layer, exposing top surface of said polycide SAC structure;

forming a tungsten plug in said hole, in said composite interlevel dielectric layer, contacting top surface of underlying, said polycide SAC structure; and forming an interconnect metallization structure, overlying and contacting, top surface of said tungsten plug, in said hole, in said composite interlevel dielectric layer.

16. The method of claim 15, wherein said first polysilicon layer, of said polycide gate structures, is deposited using LPCVD processing, at a temperature between about 500° to 700° C., to a thickness between about 500 to 1500 Angstroms, using silane as a source, and using phosphine to provide in situ doping.

17. The method of claim 15, wherein said first tungsten silicide layer, of said polycide gate structures, is deposited using LPCVD procedures, at a temperature between about 400° to 600° C., to a thickness between about 750 to 1500 Angstroms, using tungsten hexafluoride and silane as a source.

18. The method of claim 15, wherein said polycide gate structure is formed via anisotropic RIE procedures, using $CHF_3$ as an etchant for said first silicon oxide layer, and using $Cl_2$ as an etchant for said first tungsten silicide layer, and for said first polysilicon layer.

19. The method of claim 15, wherein said silicon oxide spacers, on the sides of said polycide gate structures, are formed by deposition of a second silicon oxide layer, using PECVD or LPCVD procedures, at a temperature between about 300° to 700° C., to a thickness between about 1500 to 4000 angstroms, using TEOS as a source, followed by an anisotropic RIE procedure, using $CHF_3$ as an etchant.

20. The method of claim 15, wherein the space between said polycide gate structures, including said silicon oxide spacers, is between about 0.3 to 0.5 uM.

21. The method of claim 15, wherein said second conductivity imparting dopant, used to create said heavily doped source and drain region, in the space between said polycide gate structures, is arsenic or phosphorous, ion implanted at an energy between about 30 to 100 KeV, at a dose between about 1E14 to 1E16 atoms/$cm^2$.

22. The method of claim 15, wherein said SAC opening is created in said third silicon oxide layer, via anisotropic RIE procedures, using $CHF_3$ as an etchant, with said SAC opening having a dimension of about 0.4 by 0.6 uM.

23. The method of claim 15, wherein said second polysilicon layer, of said polycide SAC structure, is deposited using LPCVD procedures, at a temperature between about 500° to 700° C., to a thickness between about 450 to 650 Angstroms, using silane as a source, and using phosphine to provide in situ doping.

24. The method of claim 15, wherein said second tungsten silicide layer, of said polycide SAC structure, is deposited using LPCVD procedures, at a temperature between about 400° to 600° C., to a thickness between about 1000 to 1400 Angstroms, using tungsten hexafluoride and silane as a source.

25. The method of claim 15, wherein said polycide SAC structure is formed via anisotropic RIE procedures, using $Cl_2$ as an etchant for said second tungsten silicide layer, and for said second polysilicon layer.

26. The method of claim 15, wherein said composite interlevel dielectric layer is comprised of an overlying boron-phosphorous doped, silicon oxide layer, deposited using PECVD procedures, at a temperature between about 500° to 700° C., to a thickness between about 3000 to 12000 Angstroms, using TEOS as a source, and comprised of an underlying layer of silicon oxide, deposited using PECVD procedures, at a temperature between about 300° to 700° C., to a thickness between about 1000 to 2000 Angstroms, using TEOS as a source.

27. The method of claim 15, wherein said RTA procedure, used to reduce the level of native oxide at the interface between said second polysilicon layer, and said heavily doped source and drain region, in said SAC opening, is performed at a temperature between about 950° to 1100° C., for a time between about 10 to 60 sec., in a nitrogen ambient.

28. The method of claim 15, wherein said tungsten plug is formed in said hole in said composite interlevel dielectric layer, via selective deposition of tungsten, using LPCVD procedures, at a temperature between about 400° to 500° C., using tungsten hexafluoride as a source.

* * * * *